United States Patent [19]

Sanya et al.

[11] Patent Number: 5,357,285
[45] Date of Patent: Oct. 18, 1994

[54] METHOD FOR THE SORTING OF PROGRAM LOCATIONS

[75] Inventors: Olufemi Sanya; Norbert Eigeldinger; Rainer Fechner, all of Villingen, Fed. Rep. of Germany

[73] Assignee: Deutsche Thomson-Brandt GmbH, Villingen-Schwenningen, Fed. Rep. of Germany

[21] Appl. No.: 836,307

[22] PCT Filed: Aug. 14, 1990

[86] PCT No.: PCT/EP90/01334
§ 371 Date: Feb. 5, 1993
§ 102(e) Date: Feb. 5, 1993

[87] PCT Pub. No.: WO91/03102
PCT Pub. Date: Mar. 7, 1991

[30] Foreign Application Priority Data
Aug. 23, 1989 [DE] Fed. Rep. of Germany .... 3927837.9

[51] Int. Cl.$^5$ .............................................. H04N 5/44
[52] U.S. Cl. ..................................... 348/716; 348/718; 455/186.2
[58] Field of Search ................. 358/191.1, 194.1, 185, 358/160; 455/186.1, 186.2, 352; 348/731, 734, 722, 716, 718; H04N 5/44

[56] References Cited

U.S. PATENT DOCUMENTS

| 4,367,559 | 1/1983 | Tults | 455/186.2 |
| 4,779,134 | 10/1988 | Mak | 358/185 |
| 4,821,121 | 4/1989 | Beaulier | 358/160 |
| 5,048,119 | 9/1991 | Wassink | 455/186.1 |
| 5,152,011 | 9/1992 | Schwob | 455/186.1 |

*Primary Examiner*—Mark R. Powell
*Assistant Examiner*—Jeffrey S. Murrell
*Attorney, Agent, or Firm*—Joseph S. Tripoli; Peter M. Emanuel; Frederick A. Wein

[57] ABSTRACT

If previously stored transmitters allocated to certain program settings in an entertainment electronics appliance are reallocated to the usual program settings, e.g., because of a changed transmitter distribution arrangement due to a change of location, time consuming re-programming becomes necessary. The present invention concerns obtaining a simple sequencing process for reallocating previously stored channels to the desired program setting number. A microprocessor receives a command, and within a time window determined by the command, reads previously programmed data concerning two selected program settings from a main memory into a first auxiliary memory, and from this auxiliary memory into a second auxiliary memory, interchanging the channel numbers, and from the second auxiliary memory into the main memory again, so as to keep the same program numbers.

4 Claims, 1 Drawing Sheet

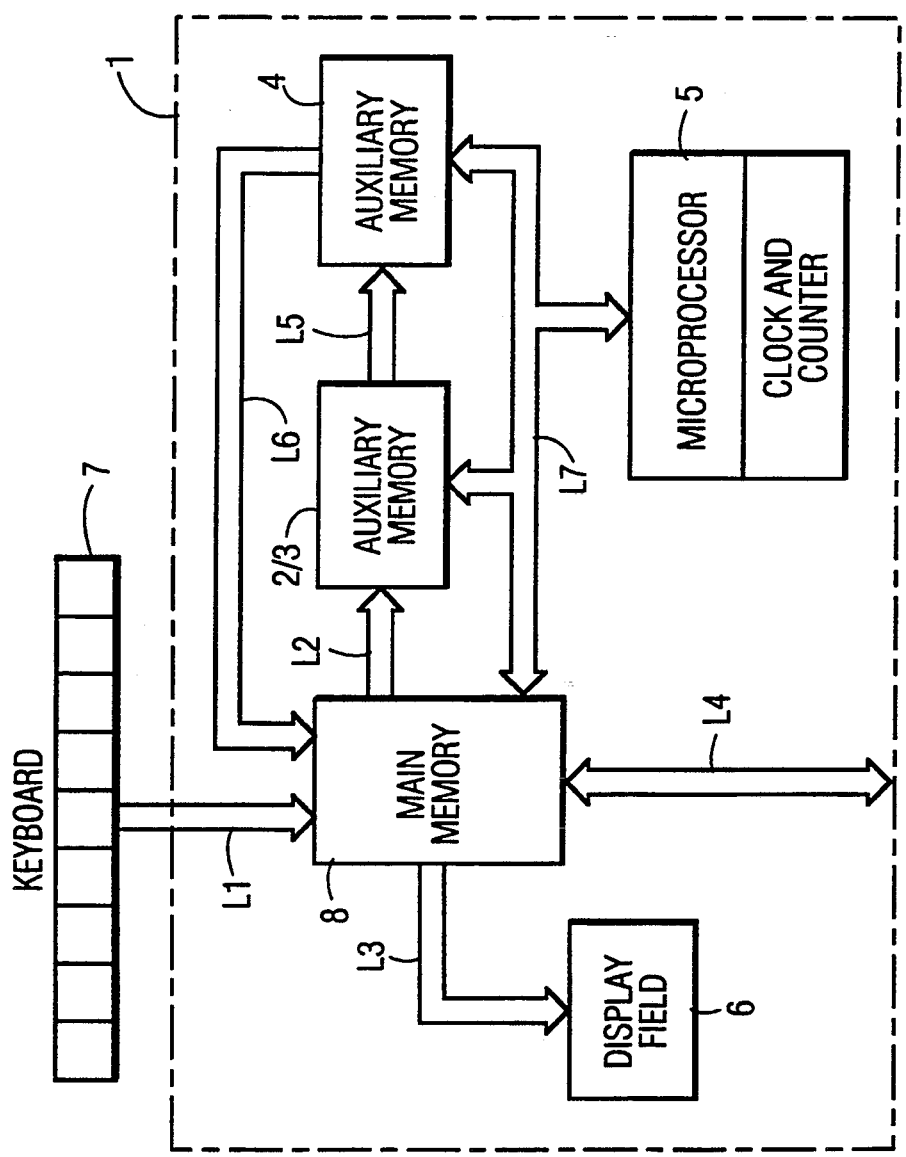

METHOD FOR THE SORTING OF PROGRAM LOCATIONS

With entertainment electronics devices, for example, video recorders, it is known to program transmitters (stations) which can be received at the location of the receiver into a memory facility in the device in order to be able to address these through depressing a key for the purpose of simple operation of the device or by means of a remote control. Thereby, a program location or program number is allocated to a particular station and its channel number which corresponds with a particular frequency. Modern devices exhibit many addressable program locations whereby, the number of the locations can even exceed the number of receivable stations. With such devices it would be possible to allocate all reception channels which can be theoretically received within a large reception area to a program location number each in one programming process. However, only a few of these programmed channels can be received at the reception point. Therefore, for general outline reasons, it is practical to sort the receivable channels, for example, according to the increasing allocation of the program location number. This can happen through individual programming. Also, with a change of reception point the individual programming would have to be carried out again. However, such re-programmings mean a great expenditure of time.

It is the object of the invention to render possible a desired allocation of receivable channels to program location numbers, for example, according to increasing allocation, from the many pre-programmed channels through a simple sorting process.

In principle, always the ratings (channel numbers) stored in two program locations, which are successively called up, are exchanged with each other through internal control within the device.

Thereby, it is possible in a simple way to allow a desired allocation of the receivable channels. In order to make this sorting process as easy as possible for the operator time processes are chosen through which the operator is guided. By depressing a program key intended for the exchange for a longer period of about 1 through 4 seconds, the corresponding program location (program-NR) is marked internally for the exchange with the stored rating (channel-NR). The exchange process is triggered when the data allocated to this program key is read into the auxiliary memory. The memorized data (program-NR and channel-NR) are indicated in devices with a display. Simultaneously, an internal clock starts which, for example, is contained in a microprocessor or is formed from a clock pulse generator and a counter in order to open a time window for about 5 seconds. Likewise, the time window can be indicated, for example, through flashing of the data which has already been displayed for the exchange or by a particular symbol.

Likewise, by depressing a second program location key for a longer period of 1 through 4 seconds within the given time window of 5 seconds, whose rating (channel-NR) is to be exchanged with the first key, this data is also read into an auxiliary memory. Likewise, at the same time an indication for the data (program-NR and channel-NR) allocated to this program location occurs. The desired allocation occurs through an interchange of the ratings (channel-NR) of the two called-up program locations by means of a processor which also controls the displayed indications, this process being known as such from computer technology. Likewise, the resulting interchange can be presented as a confirmation on the display.

Subsequently, the invention shall be better illustrated by means of a FIGURE which shows a block diagram of the circuit arrangement for performing the sorting process according to aspects of the invention.

The FIGURE shows a block circuit diagram for the sorting process. A memory facility 1 has a main memory 8 which can be designed as a dynamic RAM. Let it be assumed that the individual program locations (PR-NR) are already allocated to the ratings (channel-NR) in the main memory 8. A key on the keyboard 7 is allocated to always one program location (PR-NR). The corresponding rating (channel-NR) which is stored in the main memory 8 is output by depressing a key and controlled via the line L1. The control happens in connection with the microprocessor 5 via the data line L7. On the one hand, the data can be output via the line L3 to a display 6 and on the other hand, via the line L4 to circuits in the device, which are not shown here, for the purpose of carrying out keyed-in control commands.

According to the invention the program location in question is marked for a data exchange by the longer depression of a key on the keyboard 7 for about 1 through 4 seconds. This marking technique is already known, for example, with programming clocks or also video recorders, and need not be better illustrated here. If a first program location for a data exchange is chosen in this way, the data for PR-NR and channel-NR is input into the auxiliary memory ⅔ from the main memory 8 via the line L2 and, at the same time, made visible in the display field 6 via the line L3. Apart from that, a time window of about 5 seconds is opened by the microprocessor 5. If a second key is depressed within the given time window, likewise for a period of 1 through 4 seconds, then the data stored therein (PR-NR and channel-NR) is also stored in the auxiliary memory ⅔ and made visible in the display field 6. If the data from the first key and the second key are written into the auxiliary memory ⅔, an exchange process occurs controlled by the microprocessor 5. Therefor, the data from the auxiliary memory ⅔, via a line L5, is written into a further auxiliary memory 4 in such a way that the first PR-NR is allocated to the second channel-NR and the second PR-NR to the first channel-NR. Then, via the line L6, this new sorted data is read into the main memory 8 through overwriting the rating (channel-NR) while retaining the PR-NR and also made visible in the display field 6 as a confirmation of the exchange process. The process is concluded with the expiration of the set time window and further exchange processes can be carried out. If a second key is not depressed within the time window then the system reverts to its already existing condition after the expiration of the time.

We claim:

1. A method for a program location sorting in an entertainment electronics device with which, in a memory facility, ratings can be inputted by way of programming, for one program location to be addressed, by one key from a keyboard for providing an output by addressing the program location for control purposes, comprising the following steps:

a) addressing of a first program location by depressing a first key of the keyboard for a predetermined time interval so that a counting circuit is activated for the purpose of timing and, within the operation time, data allocated to the first program location is read into first auxiliary memory from a main memory;

b) likewise, with the following selection of a second program location by depressing a second key of the keyboard for a predetermined time interval within a time-window which is determined by the counting circuit, the data allocated to this second program location is read from the main memory into a second auxiliary memory;

c) the rating of the first program location is allocated to the second program location and the rating of the second program location is allocated to the first program location through an exchange of data, and after the conclusion of the exchange of data, the exchanged data is stored in the main memory while the program location allocated to a particular key is retained.

2. The method according to claim 1, wherein for the purpose of checking addressed program location numbers with corresponding ratings and the sorting process are indicated by a display on one of a display field and a television screen.

3. The method according to claim 1 wherein the steps are controlled by a microprocessor.

4. The method according to claim 1, wherein the data exchange occurs in a further auxiliary memory.

* * * * *